(12) United States Patent
Garrood et al.

(10) Patent No.: US 7,145,124 B2
(45) Date of Patent: Dec. 5, 2006

(54) MULTISPECTRAL IMAGING CHIP USING PHOTONIC CRYSTALS

(75) Inventors: Dennis J Garrood, Chelan, WA (US);
Nitesh N Shah, Tucson, AZ (US);
Delmar L. Barker, Tucson, AZ (US);
Harry A. Schmitt, Tucson, AZ (US)

(73) Assignee: Raytheon Company, Waltham, MA (US)

( * ) Notice: Subject to any disclaimer, the term of this patent is extended or adjusted under 35 U.S.C. 154(b) by 217 days.

(21) Appl. No.: 10/941,204

(22) Filed: Sep. 15, 2004

(65) Prior Publication Data

US 2006/0054780 A1    Mar. 16, 2006

(51) Int. Cl.
*H01L 31/232* (2006.01)
*H04N 5/335* (2006.01)

(52) U.S. Cl. .................................. 250/208.1; 348/272
(58) Field of Classification Search ............. 250/208.1, 250/214.1; 257/432; 348/272
See application file for complete search history.

(56) References Cited

U.S. PATENT DOCUMENTS

| | | | |
|---|---|---|---|
| 2003/0063204 A1* | 4/2003 | Suda | 348/272 |
| 2005/0263675 A1* | 12/2005 | Mouli | 250/208.1 |
| 2006/0001869 A1* | 1/2006 | Tuschel et al. | 356/301 |
| 2006/0006485 A1* | 1/2006 | Mouli | 257/432 |

* cited by examiner

*Primary Examiner*—Stephone B. Allen
(74) *Attorney, Agent, or Firm*—Thomas J. Finn; Leonard A. Alkov; Kari A. Vick

(57) ABSTRACT

On-chip multispectral imaging and data management is provided in the form of an Adaptive Focal Plane Array (AFPA) that is capable of spectral tunability at the pixel level. Layers of photonic crystals are registered with pixels of a broadband focal plane array. Spectral tuning is accomplished by switching the photonic crystal layers on/off and/or by changing their material structure to tune their photonic band gaps and provide a passband for incident photons. The photonic crystal layers are preferably segmented to independently address different regions or "cells" of pixels down to a pixel-by-pixel resolution. The AFPA may simultaneously sense different regions of a scene at different spectral wavelengths, spatial resolutions and sensitivities.

30 Claims, 8 Drawing Sheets

"On" (reflective) state

"Off" (transmissive) state

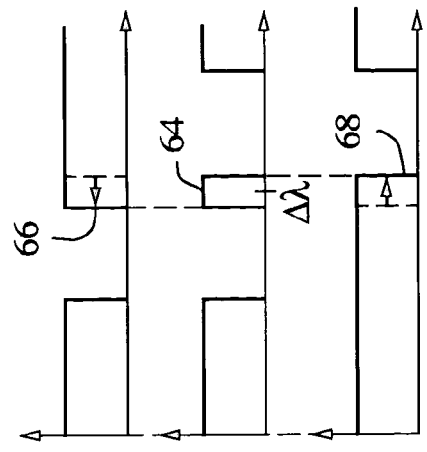
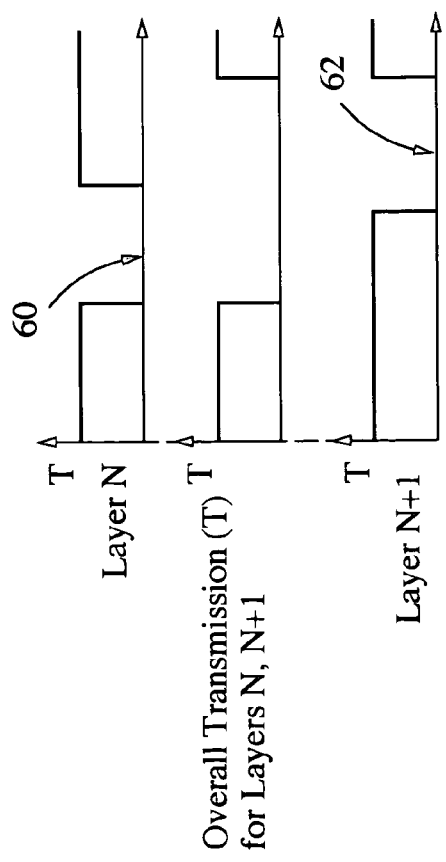
Fig. 5a
Fig. 5b
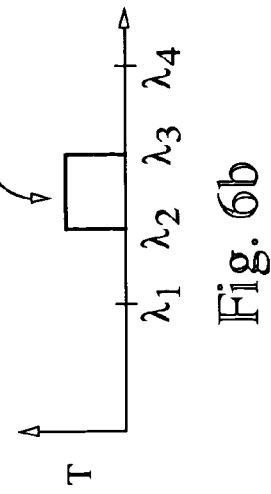
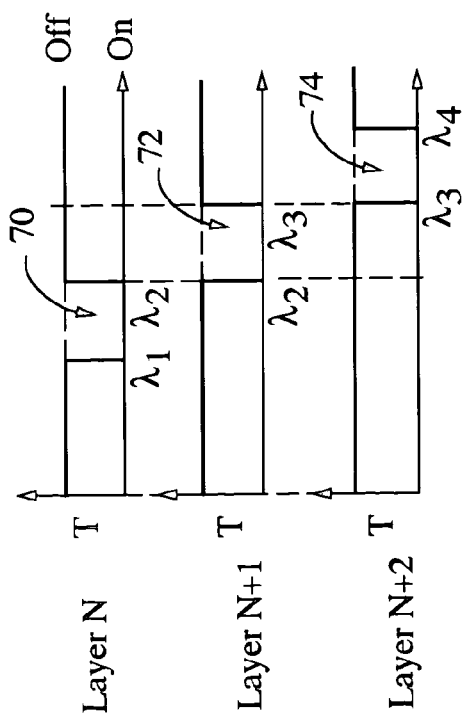
Fig. 6a
Fig. 6b

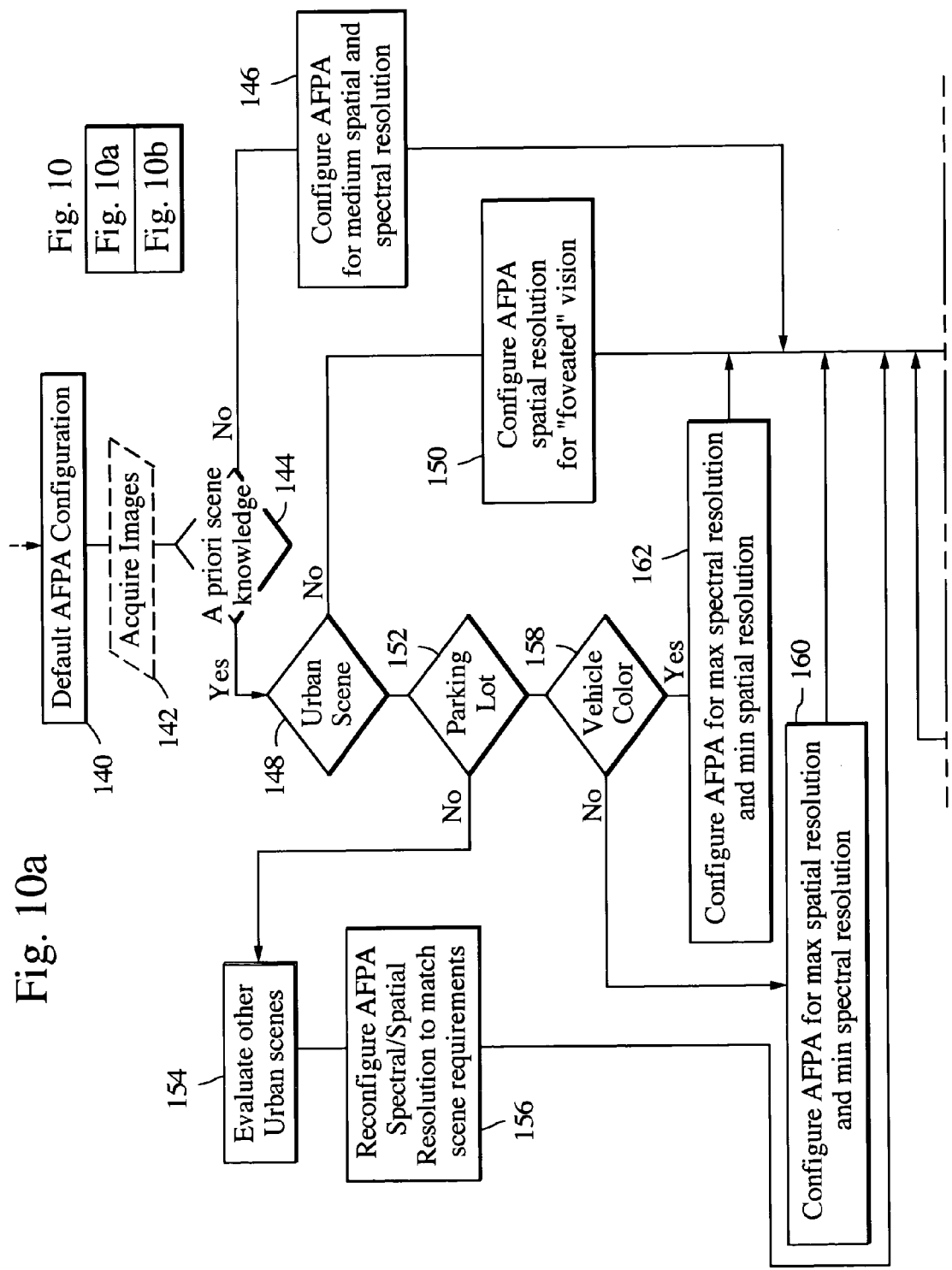

MULTISPECTRAL IMAGING CHIP USING PHOTONIC CRYSTALS

CROSS-REFERENCE TO RELATED APPLICATIONS

This application claims benefit of priority under 35 U.S.C. 119(e) to U.S. Provisional Application No. 60/543,810 entitled "Pixel-by-Pixel Multispectral Sensing on a Chip: The Adaptive Focal Plane Array" and filed on Feb. 10, 2004, the entire contents of which are incorporated by reference.

BACKGROUND OF THE INVENTION

1. Field of the Invention

This invention relates to on-chip multispectral imaging and more specifically to the incorporation of photonic crystals and integrated processing capability with a focal plane array to provide spectral tunability and spatial agility in the form of an Adaptive Focal Plane Array (AFPA).

2. Description of the Related Art

Multispectral imagers flown on aircraft and satellite platforms have provided a wealth of information, ranging from military strategic targets to crop assessments. Multispectral image processing has demonstrated high target detection with low false-alarm rates. However, multispectral imagers suffer from limitations, including high mass, volume, and power requirements, as well as a "fire hose" of data to process off line. Transitioning multispectral imaging technology to a tactical sensor or small commercial package in which data is processed in real time will require intelligent on-chip data management. If the imager were capable of adapting spectrally and spatially on a pixel-by-pixel basis, only those wavelengths and segments of the image that are important in the scene would need to be further processed and transmitted to the user.

Historically, multispectral sensors are full-frame. None of these approaches are suitable for the necessary miniaturization needed for pixel-by-pixel tuning. Full-frame approaches include, for example, placing spectral filters in a spinning disc in front of a broadband Focal Plane Array (FPA), or using multiple detectors, each detector having its own spectral filter. The first scheme yields images in each passband at a slow rate, usually exhibiting target blurring due to motion. Also this method results in poor wavelength selectivity and provides, at most, only a few different wavebands. In the latter approach, drawbacks include detector-to-detector image registration requirements and complex opto-mechanical assemblies, and high data rates. Also, tunable liquid-crystal (LC) filters are available commercially. At least one version implements an LC device within a Fabry-Perot cavity to provide tuning over a range of wavelengths (0.4–1.7 microns) suitable for use in the telecommunications industry. Another version stacks LC-based retarders in series to provide wavelength tunability over 0.4–0.7 microns. LCs are generally useful only at wavelengths below 2 microns. The semiconductor band structure of the detector material can be engineered to achieve voltage-controlled tunability. However, this approach yields only a narrow range of tuning, and wavelength selectivity can be poor due to spectral bleeding. These systems are generally wideband, not narrowband. An approach which cascades detectors of varying responses suffers from successive shielding as the number of layers increases, limiting the number of layers to two or three.

At the present time, we are aware of two proposed approaches for pixel-by-pixel tunability. Neither approach will achieve full-spectrum tuning or high-resolution wavelength selectivity. In the first approach, a tunable Fabry-Perot (FP) interference filter is placed in front of each pixel of the FPA, with tuning achieved by translation of one of the plates. Implementation of a tunable FP filter must address issues such as the area required for the actuators, suppression of unwanted orders, and the placement of the FP filter in collimated space due to a paraxial limitation. Researchers have built FP resonators with a typical tuning range of only approximately 7% (J. Peerlings et al., "Long Resonator Micromachined Tunable GaAs—AlAs Fabry-Pérot Filter," IEEE Photonics Technology Letters 9, 1235 (1997)).

In the second approach, tunable Fresnel Zone Plates (FZPs) are used to create a multispectral AFPA. The FZP acts as a highly dispersive lens, and can be used in conjunction with a confocal pinhole to provide narrowband wavelength selection. By tuning the focal length of the zone plate (by lateral actuation of the zone plates using microelectromechanical technology), one can "scan" over a wavelength range of interest. There has been successful fabrication of FZPs using structures similar to tunable gratings. However, the scanning range is limited by the actuation technology—the devices are typically tunable by only 1–10% around the nominal unactuated value.

SUMMARY OF THE INVENTION

The present invention provides on-chip multispectral imaging and data management in the form of an Adaptive Focal Plane Array (AFPA) that is capable of spectral tunability at the pixel level.

This is accomplished by adding layers of photonic crystals registered with pixels of a broadband focal plane array (FPA). Spectral tuning is accomplished by switching the photonic crystal layers on/off and/or by changing their material structure to tune their photonic band gaps and provide a passband for incident photons. The photonic crystal layers are preferably spatially segmented to independently address different regions or "cells" of pixels down to a pixel-by-pixel resolution. The AFPA may simultaneously sense different regions of a scene at different spectral wavebands, spatial resolutions and sensitivities.

Tuning is achieved, for example, either by the use of an electro-optically active component or by deforming the structural lattice of the photonic crystal. Different tuning schemes include switching all but one non-overlapping band gaps to the reflective state to allow transmission through the fixed passband of that one layer, tuning the edges of overlapping band gaps to allow transmission through a variable passband, or by switching and tuning the band gaps to scan each successive band gap to provide a spectrally integrated signal.

Combining spectral tunability at the cell or pixel level on an FPA with an integrated signal processing layer reduces the data rate by processing only certain spatial pixels over a spectral extent containing information relevant to desired targets. An on-chip processor controls the AFPA's read out integrated circuit (ROIC) to read out the detected photons at a specified spatial resolution and integration period. The on-chip processor also controls the tuning mechanisms to select specific passbands and resolutions in the different cells independently. For example, the on-chip processor may (a) based on a priori knowledge of the scene and/or possible anomalies, set an initial configuration for the ROIC to read out the detected photons at a specified spatial resolution and integration period and for the tuning mechanism to set the passband to a specified central wavelength and bandwidth in the different cells, (b) process the read-out photons to detect any anomalies in a scene, and (c) reconfigure the ROIC and tuning mechanism to adjust the spatial resolutions, integration periods and passbands of the different cells based on the detection of the anomalies to better resolve the anomalies. The processor may also control the ROIC to store and average sequential temporal samples (images) of a scene, detect and correct spatial registration mismatches across one or more temporal images, and measure and compress the range of intensities for an image on a cell-by-cell or pixel-by-pixel basis.

Certain photonic crystal structures can be configured to select either the Transverse Magnetic (TM) or Transverse Electric (TE) polarization of the incident light. Employing such materials makes it possible to adaptively select polarization and use it as a discriminating factor in target detection.

These and other features and advantages of the invention will be apparent to those skilled in the art from the following detailed description of preferred embodiments, taken together with the accompanying drawings, in which:

BRIEF DESCRIPTION OF THE DRAWINGS

FIGS. 5 through 7 are diagrams illustrating different techniques for tuning the band gaps;

FIGS. 10a and 10b are a flowchart illustrating the spectral tuning and spatial agility of the multispectral tactical imager.

DETAILED DESCRIPTION OF THE INVENTION

The present invention describes an approach for "multispectral imaging on a chip" with real-time, pixel-by-pixel spectral selectivity in different electromagnetic wavebands in the form of an Adaptive Focal Plane Array (AFPA). The AFPA exhibits low mass, volume and power requirements, and is capable of intelligently sparsening the tremendous amount of information generated by multispectral sensors. The AFPA marries the technologies of photonic crystals (PCs), broadband detectors and signal processing on-chip. Spectral tuning is accomplished by switching the PC behavior of specific layers on/off and/or by moving the band gaps, either by using an electro-optically active component or by deforming the structure. Each PC layer is responsible for coverage of a portion of the broad operating waveband. Spatial agility is achieved in a processing layer integrated with the Read Out Integrated Circuit (ROIC) layer. Spectral agility enables bandwidth changes as a function of light level. Low light level scenes can use wide bandwidths for detection and narrow bandwidths for discrimination.

Figure 1:
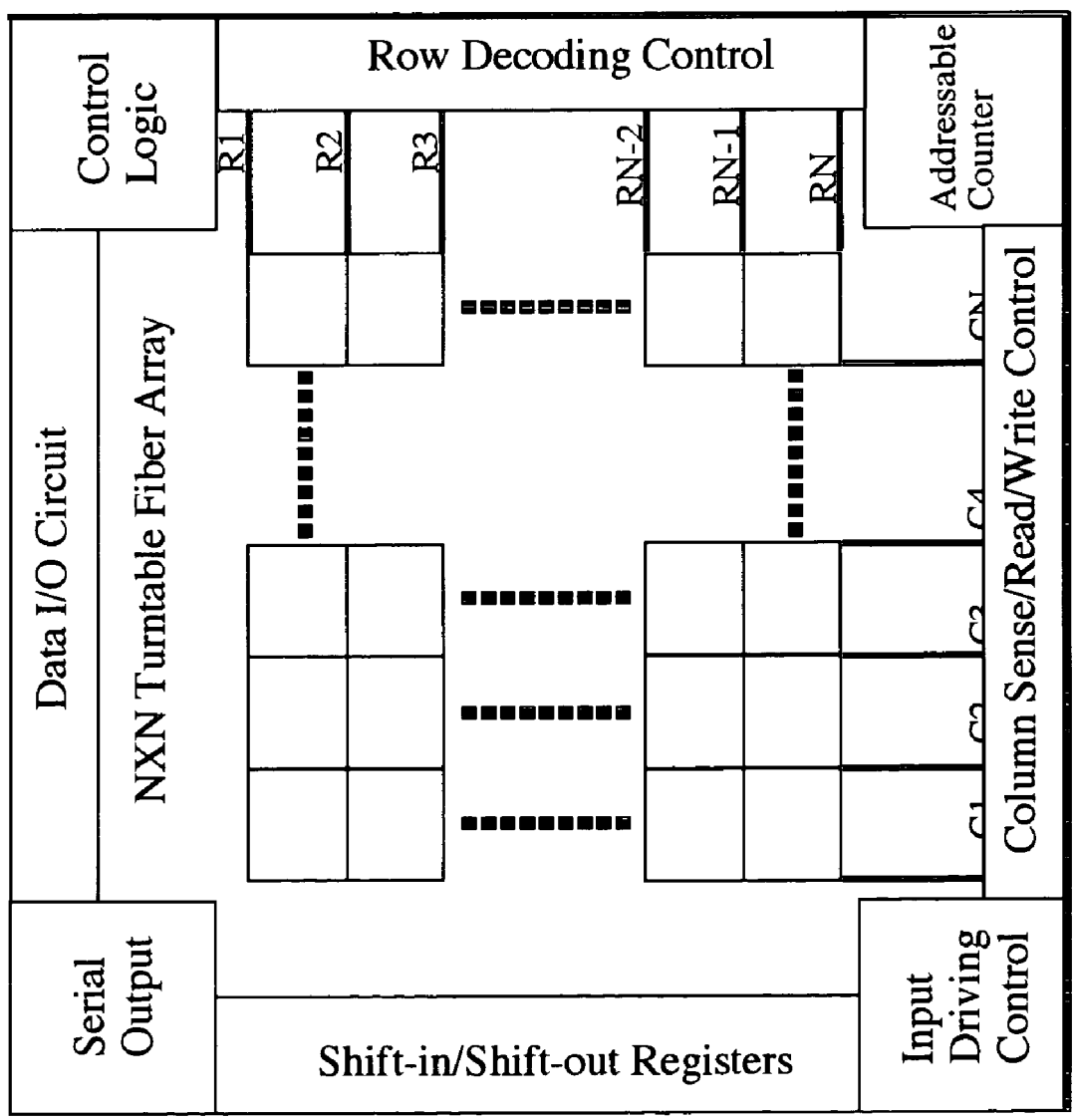
FIG. 1 is a plan view of an AFPA.
Figure 2:
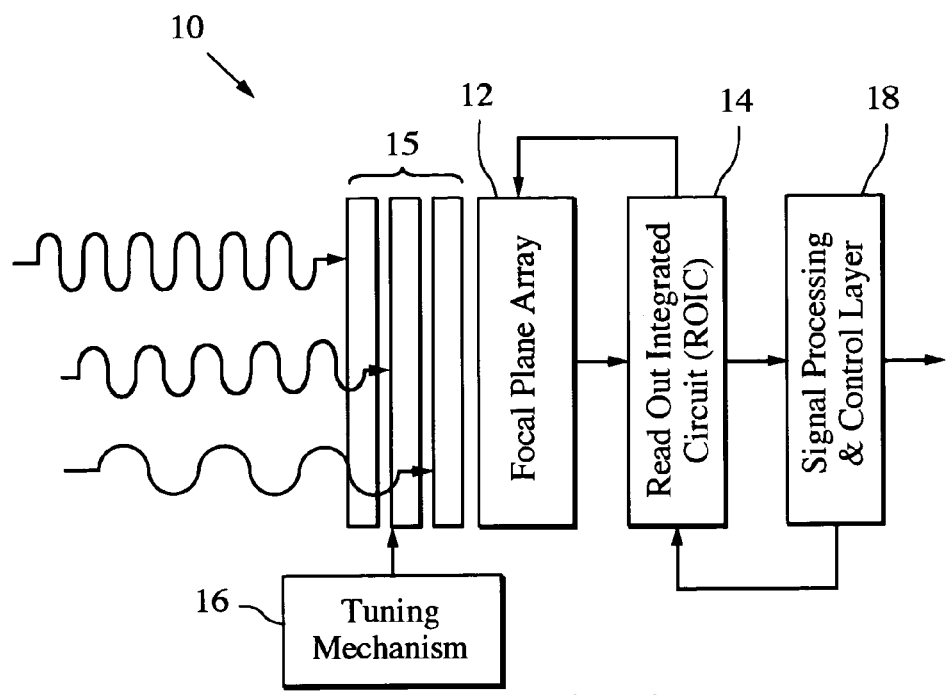
FIG. 2 is a schematic view of an AFPA in accordance with the present invention.

As shown in FIGS. 1 and 2, an AFPA 10 includes a pixelated focal plane array (FPA) 12 that detects incident photons over a broad spectral band and converts them into electrons. An ROIC 14 integrates the detected electrons over an integration period and reads them out using conventional row/column addressing techniques. The FPA may detect photons over a very broad band, say 1–12 microns, or over dedicated bands say 0.4–0.7 microns in a visible band, 0.9–1.8 microns in a short wave infrared (IR) band, 3–6 microns in a medium wave IR band, 8–14 microns in a long wave IR band, 14–22 microns in a very long IR band and 0.1 mm–1 mm in a microwave band. FPAs and their ROICs are well known in the relevant art.

In accordance with the present invention, the AFPA also includes a stack of one or more PC layers 15a, 15b . . . each having one or more photonic band gaps that block transmission of photons over respective portions of the broad spectral band. A tuning mechanism 16 controls the PC behavior of specific layers to switch the photonic band gaps on/off or to move the band gaps to create a passband, fixed or tunable, through which photons are filtered to the underlying FPA. The PC layers and tuning mechanism are segmented into "cells," groups of P×Q pixels in the M×N array, so that different cells can be tuned to detect different spectral passbands independently. The size of the "cells" can range from full-frame, i.e. one cell (P=M, Q=N), to pixel-by-pixel (P=Q=1).

The AFPA is also suitably but not necessarily provided with a signal processing and control (SPC) layer 18. Together the SPC layer 18 and ROIC 12 function to remove unwanted signals, perform analog-to-digital conversion, temporal averaging, incoherent/coherent detection, registration correction, and dynamic range compression, and control spatial/spectral segmentation of the PC layers and any anomaly detection processes in an imaged scene. Integration of this signal processing capability on-chip allows the spectral tuning and spatial agility properties of the AFPA to be fully exploited to intelligently sparsen the data generated by the chip and improve overall data management.

The underlying Photonic Crystal (PC) materials, processing and fabrication and tuning mechanisms are well developed (see for example J. D. Joannopoulos, R. D. Meade, and J. N. Winn, "Photonic Crystals: Molding the Flow of Light," Princeton: Princeton University Press (1995), or C. Lopéz, "Materials Aspects of Photonic Crystals," Advanced Materials 15, 1679 (2003). PCs have been used in such applications as directional antennas, waveguides, spectral filters, spectral multiplexers, etc. The PC layers can be tuned over a wide range (e.g., 1–12 microns), with a narrow resolution (<0.1 microns) at switching speeds needed for multispectral imaging. The PC materials can be readily integrated with the FPA and have sufficiently low attenuation that stacks of 8–12 layers are feasible.

Figure 3:
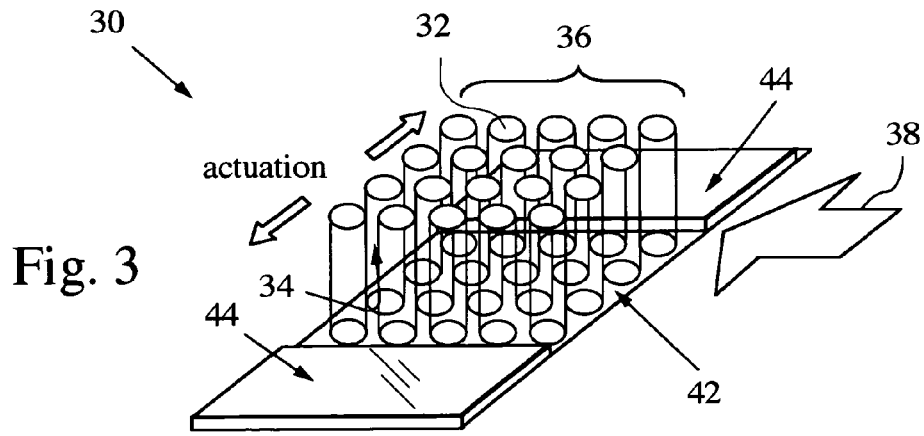
FIG. 3 is a perspective view of a photonic crystal layer and a tuning mechanism.

As illustrated in FIGS. 3 and 4, a Photonic Crystal structure 30 contains a periodic high-contrast modulation of the local index of refraction (or dielectric constant, for non-magnetic materials) in one, two or three dimensions. In this particular embodiment, dielectric rods 32 are embedded in a medium 34 with a different dielectric constant (e.g., air) and arrayed in a lattice arrangement 36. Other examples of PC structures include the inverse opal backbone, macroporous silicon, colloidal crystals, woodpile structure, Yablonovite and others well known in the field. Any two substances having sufficient contrast between their respective indices of refraction can be placed in a stable periodic arrangement with a particular geometry, spacing and shapes of the constituent substances to create a photonic band gap for a particular range of photon wavelengths. Light 38 propagating in such a structure will undergo multiple Bragg scattering from the lattice array and multiple Mie scattering off the individual scattering elements. Under certain conditions, the multiply-scattered waves interfere destructively, resulting in minimal transmission over a broad range of wavelengths, which is termed the "band gap" (a term borrowed from semiconductor physics.) The photonic band gap is said to be complete when transmission is blocked for all angles of incidence within the wavelength band. The fractional band gap (band gap wavelength width divided by band gap center wavelength) is typically 5%–30%, though in certain cases the band gap width can be as large as 60%–80%.

Figure 4A:
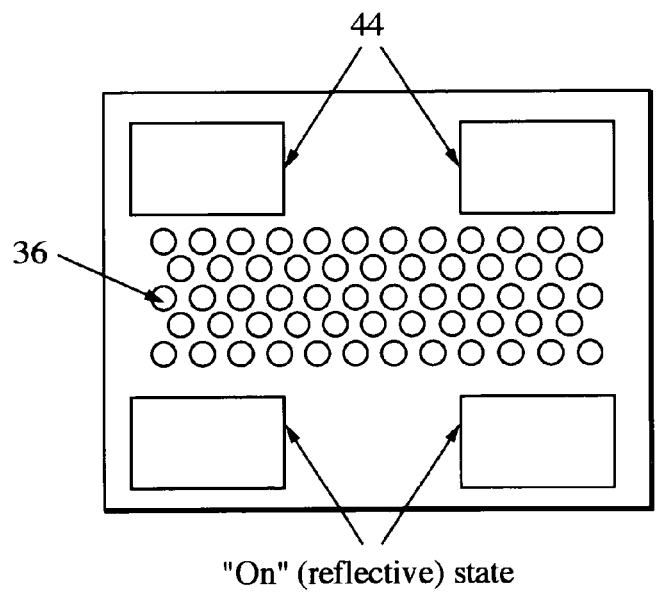
FIGS. 4a and 4b are diagrams illustrating the "On" and "Off" states of one possible photonic crystal structure.
Figure 4B:
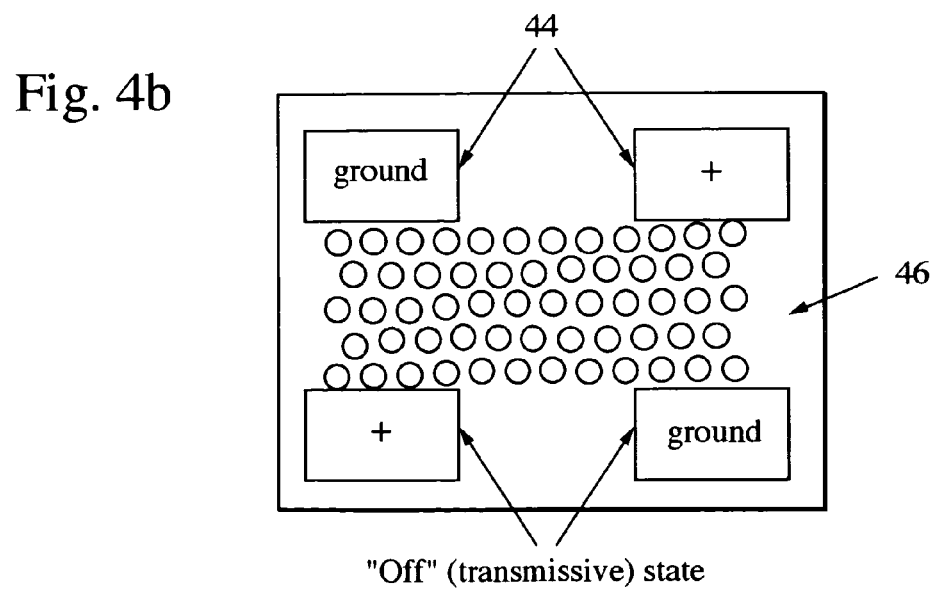

The PC material can be actively controlled to open or close the photonic band gap, or shift the edges of the band gap, on time scales compatible with standard frame rates (e.g., 60 Hz). This can be accomplished either by modulating the index of refraction contrast, changing the geometric arrangement or altering the symmetry of the scattering objects. In the illustrated embodiment, an actuator 42 including a thin film piezoelectric material (e.g., lead zirconate titanate) and a pair of electrodes 44 is used to distort the lattice geometry thus changing the Bragg scattering conditions. If the periodic lattice 36 is strained in such a manner as to maintain its periodicity but change its lattice spacing, the deformation simply alters the symmetry parameters thereby shifting the edges of the band gap. For a two-dimensional hexagonal dielectric PC composed of silicon rods in air, fabricated on a piezoelectric substrate, a shear strain of 2%–3% produces a 50%–75% shift in the band gap edges, as shown by S. Kim and V. Gopalan, "Strain-Tunable Photonic Band Gap Crystals," Applied Physics Letters 78, 3015 (2001). Conversely, if the periodic lattice 36 is strained in such a manner to create aperiodic lattice deformation 46, the band gap can be switched off as illustrated in FIGS. 4a and 4b. A strain of <3% can switch the band gap between its reflective (on) state and transmissive (off) state. The piezoelectric structure can be driven at frequencies approaching megahertz, providing ample response time for multispectral imaging applications.

There are other techniques for controlling the PC material. The index of refraction contrast can be altered by changing the index of refraction of the constituent elements. This is done by applying external electric fields to an electro-optically active constituent (e.g., liquid crystal or ferrofluid imbibed into the voids of an inverse opal or filled into the rods of a two-dimensional lattice), by changing the thermal environment of a material having a temperature-sensitive index of refraction (including liquid crystals, ferrofluids, and conducting polymers, imbibed into the voids of an inverse opal or filled into the rods of a two-dimensional lattice), or illuminating a (possibly nonlinear) photo-active material (photochromic dye aggregate evaporated into the voids of an inverse opal or filled into the rods of a two-dimensional lattice, or injecting non-equilibrium charge carriers to change the index of refraction of GaAs). The shape of the components can also be changed. A material having a high thermal coefficient of expansion can be heated or cooled. Non-circular rods forming a two-dimensional lattice can be rotated about their long axis, presenting different cross-sections to the incident light.

Band gap "on/off" switching can also be accomplished. By applying pressure to the inverse opal structure, the width of the fractional band gap can be reduced from ~10% to 0, as shown by K. Busch and S. John, "Photonic band gap formation in certain self-organizing systems," Physical Review E 58, 3896 (1998). In the case of an inverse opal structure infilled with a liquid crystal, application of an external voltage to the structure can reduce the fractional band gap from ~2% to 0. Band gap switching has also been suggested by applying an external field to a two-dimensional triangular lattice of air holes in a ferroelectric background.

Band gaps can exist independently for incident light having transverse electric (TE) or transverse magnetic (TM) polarization. For frequencies at which the band gaps overlap, there is a complete band gap. Band gap "maps" are commonly drawn for two-dimensional lattice structures, showing the regions of the TE and TM band gaps as a function of the dimensionless parameters (r/a) and (a/$\lambda n_2$/$n_1$), (see for example J. D. Joannopoulos, R. D. Meade, and J. N. Winn, supra). Here, a refers to the lattice spacing (cylinder-to-cylinder separation) and r refers to the radius of the cylinders. Using such maps, one can design a PC structure that has partially overlapping band gaps for TE and TM polarizations. Slight changes in the structural parameters and/or the indices of refraction then allow the band gap to exist for both polarization states, or for one polarization state only, or for neither polarization state (i.e., band gap effect turned "off").

Figure 7:
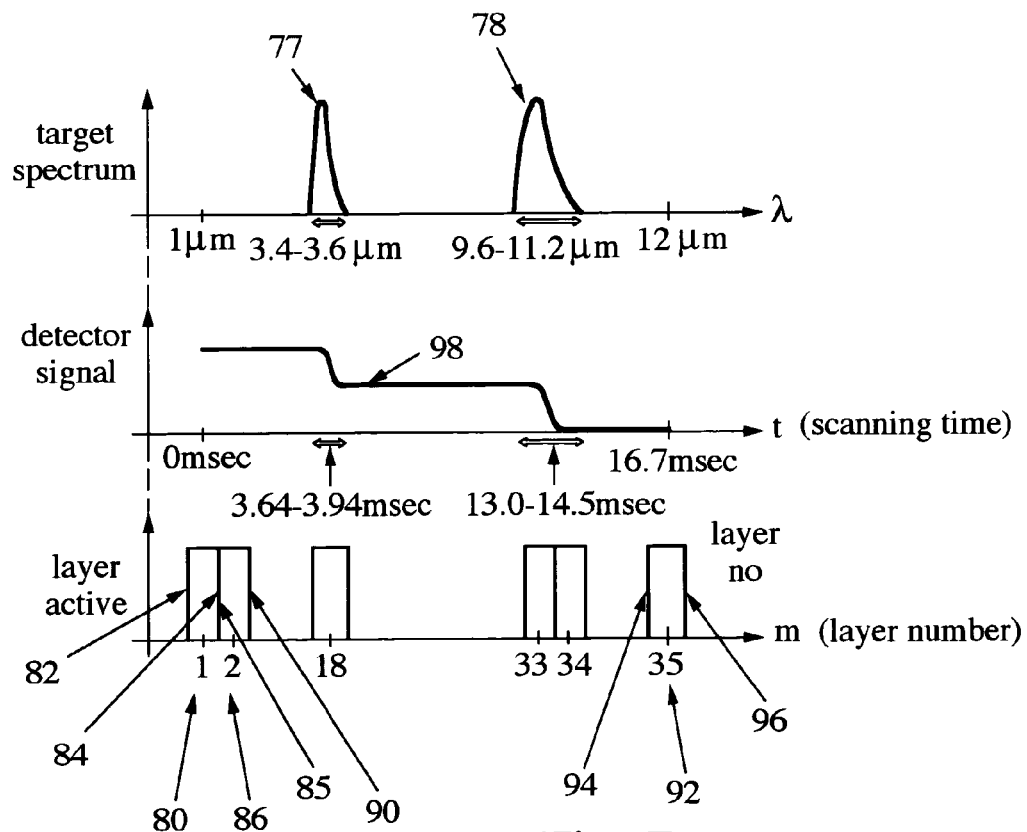

The properties of PC materials to either move the band gap edges or switch the band gap on/off can be actively controlled to produce a desired passband, fixed or variable, in the PC stack. Three different tuning techniques are currently contemplated as illustrated in FIGS. 5 through 7. In the first approach, two-dimensional lattices with overlapping tunable band gaps are used as the PC layers. At any given passband $\Delta\lambda$ there are two overlapping band gaps. As shown in FIG. 5a, band gaps 60 and 62 overlap for a certain range of wavelengths blocking and transmission with that range. The addition of more layers to the stack extends this range. To obtain transmission in a desired passband 64, the overlapping band gaps 60 and 62 covering that passband are tuned away from the passband, allowing transmission as shown in FIG. 5b. The width of the passband can be adjusted based on the relative placement of the close-by edges 66 and 68 of the previously overlapping band gaps. This approach can provide broadband tuning over a range of 1–12 microns by using 12 PC layers with passband resolutions of less than 0.1 microns. The broadband range is only limited by the spectral range of the FPA, the fractional band gap (here assumed to be 40%), and the attenuation in the PC layers. The passband resolution is limited by the accuracy and reliability of the tuning mechanism, for example how precisely a piezoelectric substrate can be strained.

In the second approach, layers of PC structures with non-overlapping, switchable band gaps 70, 72, and 74 are used as shown in FIG. 6a. All layers are switched to the reflective state ("on"), except one: the layer whose band gap encompasses the desired passband 76 shown in FIG. 6b is switched to the transmissive state ("off"). The PC structure suitably uses two-dimensional lattices of dielectric or metallic rods, or an inverse opal backbone infiltrated with a birefringent nematic liquid crystal. In this approach, the passband typically has a fixed width equal to the band gap of the "off" layer. However, it is possible to directly manipulate the width of the band gap to change the resolution of the passband.

The third approach uses both switching and tuning of PC structures. As an illustrative example, consider a series of 35 PC layers, with layers 1–10 having bandwidth 0.1 microns, layers 11–20 having bandwidth 0.2 microns, layers 21–30 having bandwidth 0.4 microns, and layers 31–35 having bandwidth 0.8 microns, with layer 1 covering the range 1.0–1.1 microns and layer 35 covering the range 11.2–12 microns. Consider a target with spectral signature in two wavebands 77 and 78, 3.4–3.6 microns and 9.6–11.2 microns respectively, corresponding to the band gaps of layer 18 and layers 33 and 34, respectively. Initially all layers are switched off (transmissive); the detector signal is sampled. As illustrated in FIG. 7, the first band gap 80 is switched on, but with both band gap edges 82, 84 effectively tuned to the same wavelength (e.g., 1.0 microns), so that the band gap has zero width. This band gap 80 is then tuned such that the left edge 82 remains at 1.0 microns, and the right edge 84 moves out to $\lambda_{1,max}$ (e.g., 1.1 microns); the detector signal 98 is sampled during this process. Now the second band gap 86 is switched on. The second layer's band gap initially has both edges 88, 90 effectively tuned to $\lambda_{1,max}$. The right edge 90 is scanned out to $\lambda_{2,max}$ (e.g., 1.2 microns); and the detector signal 98 is sampled during this process. This process continues through the stack; then, in the final layer, n (e.g., 35), the band gap 92 is switched on, with both edges 94, 96 effectively at $\lambda_{n-1,max}$ (e.g., 11.2 microns); the right edge 96 is scanned out to $\lambda_{n,max}$ (e.g., 12 microns); the detector is being sampled 98 during this process. The stack has gone from being completely transmissive (all layers switched off) to being completely reflective (all layers switched on). Initially, the detector signal 98 starts "high" since the entire broadband signal is passed through the transmissive PC layers. The detector signal 98 remains high until the band gap of layer 18 is switched off, blocking the target signature 77 in the 3.4–3.6 microns waveband. The detector signal 98 remains in the "middle" range until the band gaps of layers 33 and 34 are switched off, blocking the target signature 78 in the 9.6–11.2 microns waveband, causing the detector signal 98 to take a "low" value. As the remaining layers are switched off, resetting them to the transmissive state, the detector signal 98 remains "low" until the cycle begins anew. In this manner, on each cycle, a spectrally integrated signal is achieved. Signal processing techniques can then be used to provide information on any selection of passbands, within spectral resolution dictated by the sampling frequency.

Certain photonic crystals exhibit multiple band gaps. In the case of high-dielectric cylinders embedded in air, arranged in a two-dimensional quasiperiodic tiling, up to three simultaneous complete band gaps (having up to 30% fractional band gap) have been identified. An inverse $CaF_2$ backbone structure having two complete band gaps (with fractional band gaps 9% and 3%, respectively) is also known. It is well known that certain PC structures support multiple non-overlapping band gaps for light of different incident polarization (see for example J. D. Joannopoulos, R. D. Meade and J. N. Winn, supra). Such structures having multiple band gaps can be tuned via a combination of the aforementioned methods, in a manner to tune or switch one band gap with minimal effect on the other band gaps. V. Babin, P. Garstecki, and R. Holyst, "Multiple photonic band gaps in the structures composed of core-shell particles," Journal of Applied Physics 94, 4244 (2003) suggest a photonic crystal exhibiting multiple band gaps, each band gap being related to a specific interface found within a series of concentric, spherical, multilayered shells, each shell being composed of a material with a dielectric constant different from that of the other shells. Tuning the dielectric constant of an inner or an outer material allows control of individual band gaps. Tuning can be achieved, for example, by acting on electro-optically active or photo-active materials embedded in the dielectric host media. More generally, construct photonic crystals using not just two materials with different indices of refraction, but using three of more materials with different indices of refraction. Scattering from the interfaces between different types of materials will lead to the development of multiple band gaps. It is then possible to affect only one band gap, while leaving the other band gaps unchanged, by tuning the properties of one of constituent materials, using one or more of the different aforementioned methods.

Figure 8A:
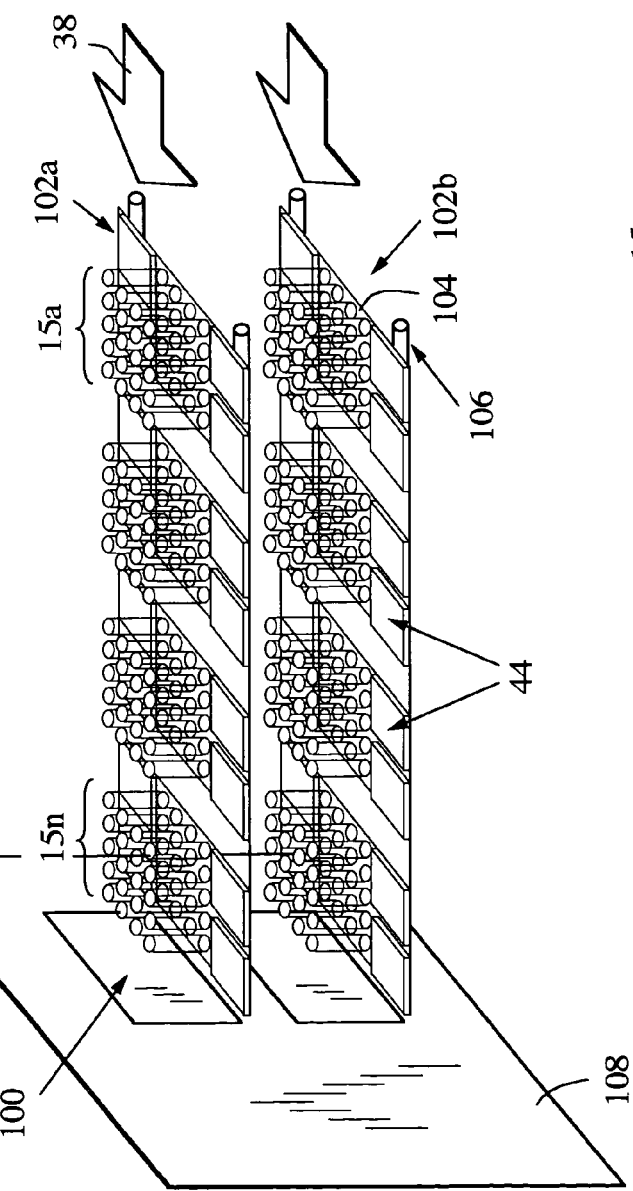
FIGS. 8a and 8b are perspective and side views of a pixel-by-pixel addressable AFPA.

As mentioned above, the AFPA 10 is formed by adding layers of photonic crystals 15a, 15b . . . registered with pixels 100 of the broadband focal plane array (FPA) 12. As shown in FIG. 8a, the photonic crystal layers are preferably segmented into cells 102a, 102b . . . to independently address different regions of pixels 100 down to a pixel-by-pixel resolution. The stack of PC layers can be diced out of a single wafer to simplify the packaging process of the device. The stacks are then vertically aligned in an array with one stack or cell corresponding to each pixel or group of pixels in the detector array. In this embodiment, each cell is mounted on a structural support 104 and a pair of support railings 106. The packaging can be simplified by replacing the railings with a support structure where the stacks are inserted in their appropriate slots. A multilayer stack is typically 0.5 mm to 1.0 mm thick.

Figure 8B:
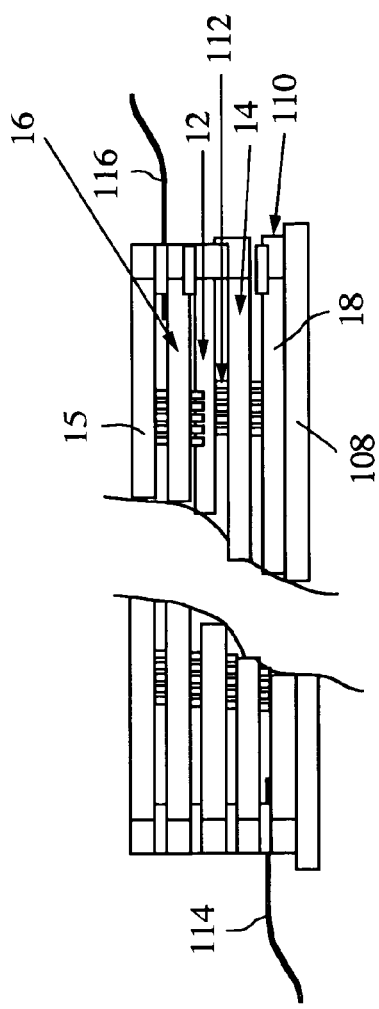

As shown in the side view in FIG. 8b, the AFPA 10 is a single-chip solution built on a motherboard 108. In this particular embodiment, the signal processing and control layer integrated circuit 18 is mounted on the motherboard. The ROIC 14 is mounted thereon using a combination of mounting blocks 110 around the periphery to provide structural support and indium bumps 112 internally to provide electrical connections. The FPA 12, a tuning mechanism 16 and the PC layers 15 are mounted in a similar fashion. An ROIC cable 114 and a tuning control cable 116 are connected to the respective chips and brought off-chip to interface with, for example an autonomous target recognition (ATR) processor.

Figure 9:
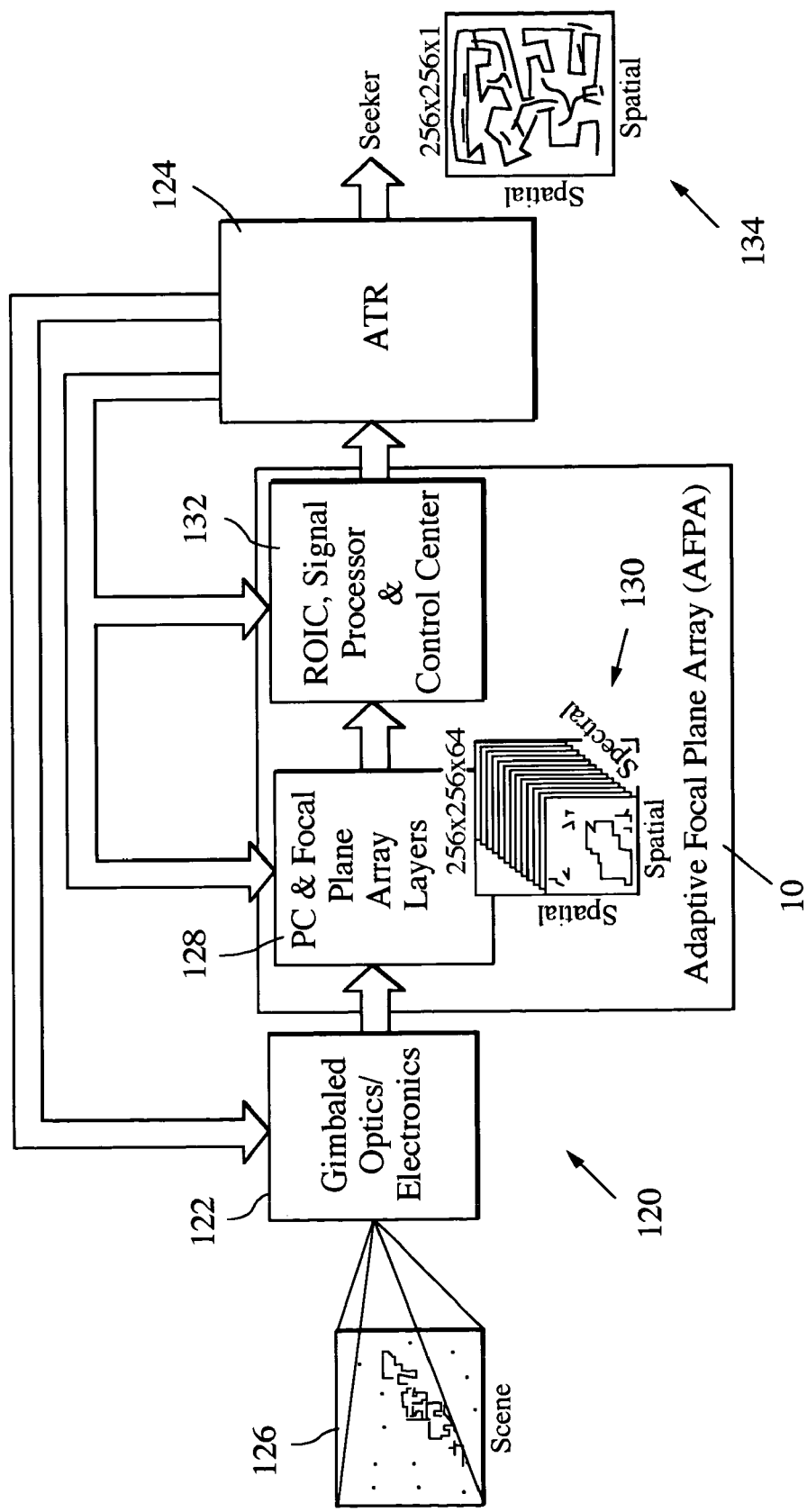
FIG. 9 is a functional block diagram of a multispectral tactical imager including an AFPA.

As shown in FIGS. 9 and 10, one particular application of the AFPA 10 is as an intelligent infrared (IR) sensor in a missile target recognition system 120 that provides the "front end" to a missile's IR seeker, performing the functions of initial detection, identification and acquisition. This information is then handed off to the seeker that locks onto the IR signature of the target and guides the missile onto the target. Presently deployed IR seekers are not smart enough to overcome the wide variety of countermeasures employed by adversaries. The spectral tunability, spatial agility and integrated signal processing capabilities of the AFPA provide a promising solution to counter the countermeasures and locate targets in cluttered urban and camouflaged environments. The use of IR seekers is also being proposed for new munitions such as projectiles and small missiles. This class of seeker must be inexpensive, survive gun launch, use meager amounts of power and be physically small. The AFPA satisfies these requirements.

The target recognition system 120 includes the AFPA 10, gimbaled optics and electronics 122 and an ATR 124 all collocated on the missile. The gimbaled optics and electronics 122 respond to slew and zoom commands from the ATR 124 to move the optical field of view of the AFPA within a field of regard to image a scene 126. These commands will change as targets are detected and the missile moves toward the target.

The AFPA 10 receives spatial extents (i.e., the pixels of interest within the full range available for the scene), spectral ranges, bandwidth (i.e., the start and stop wavelengths for each spectral band) and sensitivity parameters from the ATR 124. The PC layers and FPA 128 in turn control the spatial and spectral ranges to extract only the desired information. For example, the AFPA may be capable of imaging a data cube 130 consisting of 256×256 pixels over 64 narrow spectral bands. The AFPA controls the dimensions of this data cube to sparsen the data that must be processed on-chip and then passed off-chip to the ATR. The ROIC and signal processing and control layers 132 process each image (spectral slice in the data cube) to perform a number of tasks including analog-to-digital conversion, temporal averaging of the images, removing unwanted signals (noise), controlling the signal detection process, incoherent/coherent detection, registration correction, dynamic range compression, spatial/spectral segmentation, and controlling the anomaly detection process.

The ATR 124 receives a list of possible anomalies from AFPA 10. The ATR maintains a prioritized target list with an "anomaly" profile for each of the targets and maintains target track files. The ATR processes each anomaly to reject clutter/jammer interference and compares the detected anomaly against its profile lists. At this point the ATR can either declare the anomaly to be a target and pass the coordinates and other relevant information to the missile seeker or it can reconfigure the AFPA to gather additional information in order to determine whether the anomaly is in fact a target. At this point, the data cube 130 may be reduced to a single image 134 that is spatially conformal to the target and at the best spectral band for differentiation, in order to maximize information in the lowest-dimensional space.

Figure 10B:
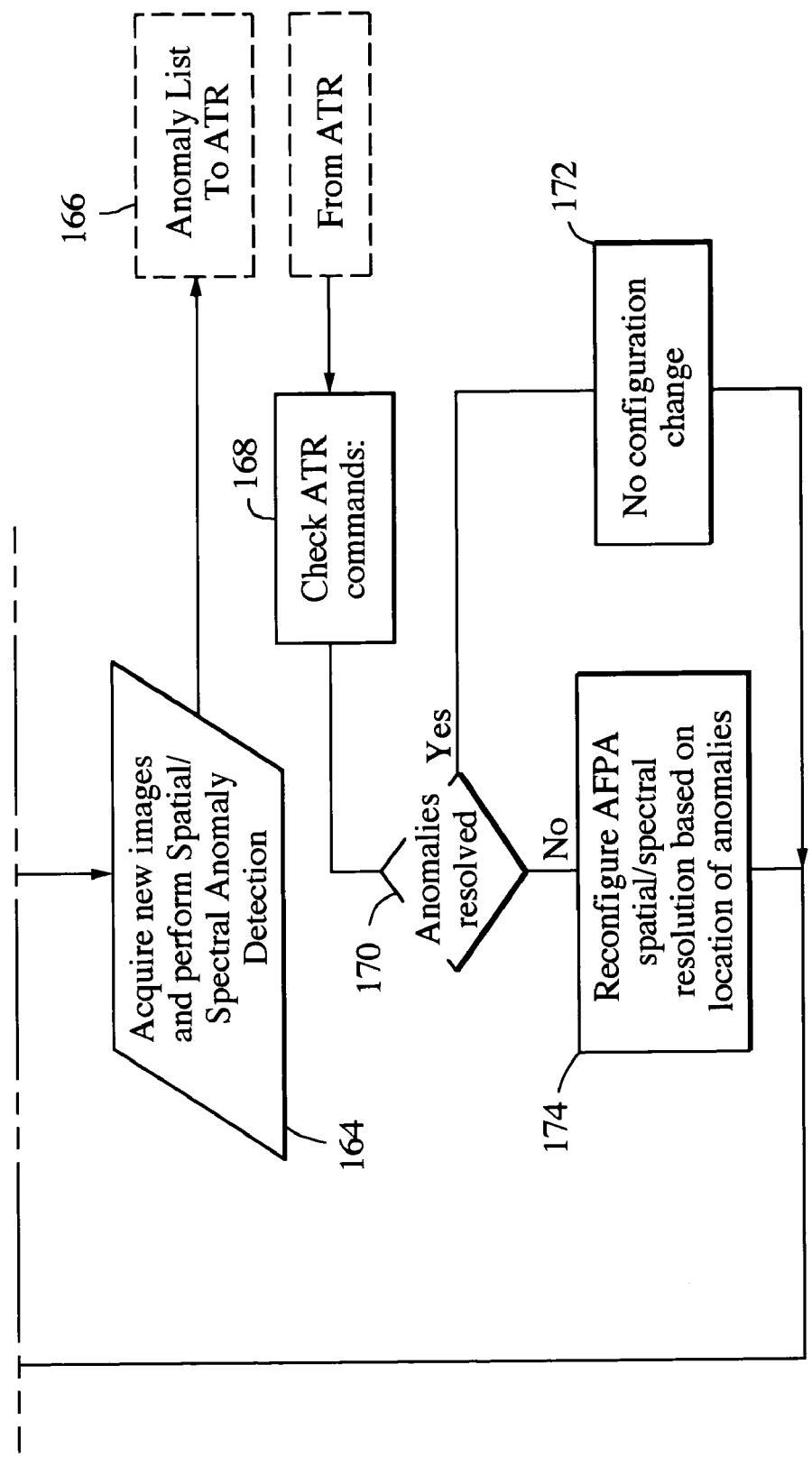

One example of the interaction between the ATR and AFPA to dynamically extract and evaluate information from a scene is illustrated in FIGS. 10*a* and 10*b*. Initially, the AFPA assumes a default configuration (step 140). Once an image is acquired (step 142), the ATR determines whether it has any a priori knowledge of the scene (step 144). If no, the AFPA is suitably configured to have a medium spatial and spectral resolution (step 146). If yes, the ATR determines whether the imaged scene is an urban scene (step 148). If no, the ATR configures the AFPA spatial resolution for "foveated" vision, i.e. high resolution on the look axis and low resolution around the periphery and medium spectral resolution (step 150). If yes, the ATR determines if the scene is of a parking lot (step 152). If no, the ATR can test for other urban scenes (step 154) and reconfigure the AFPA spectral/spatial resolution to match the scene requirements (step 156). If yes, the ATR determines whether a target vehicle's color is known a priori (step 158). If no, the ATR configures the AFPA for max spatial resolution in order to detect shapes and minimum spectral resolution to encompass all colors (step 160). If yes, the ATR configures the AFPA for max spectral resolution to detect the particular color and minimum spatial resolution (step 162).

Once the AFPA is reconfigured based on any a priori information about the scene or targets within the scene, the AFPA acquires a new data cube of images and performs spatial/spectral anomaly detection on the data (step 164) to generate an anomaly list. Anomaly detection is the process of finding and labeling pixels that correspond to a material based on spectral content and/or shapes based on comparison to known library shapes of significant targets. In the spectral case, spectra are taken at various pixels (determined by spatial segmentation or at random) through a cube of wavelength-ordered data consisting of two-dimensional spatial planes and the spectral plots are checked for outliers by using correlation or comparison with prestored plots for specific materials. In the spatial case, commonly known spatial segmentation algorithms (e.g., edge detection) or morphology are used to identify spatial regions of interest and select a subset based on some predetermined target criteria.

For material identification, all materials within the scene are projected onto the AFPA through the optics and consist of both single-material (pure) or multi-material (mixed) pixels. The spectrum of each pixel may be represented by a point in n-dimensional space (n is the number of spectral bands), where the value of a given coordinate is the digital number measured by the sensor in that waveband. For M pixels in the image there will be M points in n-dimensional space. A minimal-volume simplex that encloses the data can be constructed. The vertices of this convex structure are termed "endmembers." Endmembers are considered "pure" representations of a material and the points inside the convex structure are mixtures of these materials.

The target detection problem is often posed as a binary hypothesis test: a given pixel is either target or non-target. Some complications to this problem are intuitively obvious. In surveillance applications, the target is small relative to the image and some (or most) images may not contain targets, i.e., the observation space containing the target class may be sparsely populated or empty. This heightens the difficulty in training a data-driven statistical detector or classifier. Also, the non-target class or classes may contain a variety of different materials and may, therefore, be difficult to accurately model. In the tactical application, one is generally looking for vehicular objects and the assumption is that these spectra are sufficiently different from those of the background, which may contain vegetation, concrete, etc.

The anomaly list is then sent to the ATR for evaluation (step 166). The ATR accesses prestored and updated information on potential targets, may integrate anomaly and other information from multiple sensors and can use more sophisticated target identification algorithms. The AFPA then checks for ATR commands (step 168) to determine whether the anomalies were resolved (step 170). If yes, the AFPA is left alone (step 172). Otherwise, the ATR reconfigures the AFPA to change the spatial and/or spectral resolution based on the location and spectral properties of the anomalies to gather additional information to either accept or reject each anomaly as a target (step 174).

The inherent capabilities of the AFPA to simultaneously refine and sparsen the detected data about a scene greatly enhance the capability of the ATR to process the data and accurately detect targets even in the face of aggressive countermeasures.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. A multispectral imaging (MSI) chip, comprising:
   a focal plane array (FPA) that detects incident photons over a broad spectral band;
   at least one photonic crystal layer having one or more photonic band gaps that block transmission of photons over one or more portions of the broad spectral band; and
   a tuning mechanism that tunes said photonic band gaps to filter photons through said at least one layer within a passband to said FPA.

2. The MSI chip of claim 1, wherein the FPA is pixelated to detect M×N images of incident photons originating from a scene.

3. The MSI chip of claim 2, wherein each said at least one photonic crystal layer is spatially segmented to independently filter cells comprising P×Q pixels.

4. The MSI chip of claim 3, wherein P equals Q equals 1.

5. The MSI chip of claim 3, wherein said FPA simultaneously detects photons in a first passband in a first cell and photons in a different second passband in a second cell.

6. The MSI chip of claim 1, wherein at any given wavelength in the broad spectral band there are two overlapping photonic band gaps, said tuning mechanism moving the overlapping band gaps that cover the passband away from the passband allowing transmission.

7. The MSI chip of claim 6, wherein the tuning mechanism controls the width of the passband by the relative placement of edges of the previously overlapping band gaps.

8. The MSI chip of claim 1, wherein the photonic band gaps are non-overlapping and switchable between reflective and transmissive states, said tuning mechanism switching all of the band gaps to the reflective state except one and switching the one layer whose band gap encompasses the passband to the transmissive state.

9. The MSI chip of claim 1, wherein at least one of said photonic crystal layers exhibits a plurality of said photonic band gaps.

10. The MSI chip of claim 9, wherein the tuning mechanisms tunes one of said plurality of photonic band gaps while leaving the others unchanged.

11. The MSI chip of claim 1, wherein the number of photonic crystal layers is between 1 and 12.

12. The MSI chip of claim 1, wherein the photonic band gaps select either the transverse magnetic (TM) or transverse electric (TE) polarization of the incident light.

13. The MSI chip of claim 1, wherein said broad spectral band spans 1–12 microns.

14. The MSI chip of claim 1, wherein said broad spectral band is selected from one of 0.4–0.7 microns in a visible band, 0.9–1.8 microns in a short wave infrared (IR) band, 3–6 microns in a medium wave IR band, 8–14 microns in a long wave IR band, 14–22 microns in a very long IR band and 0.1 mm–1 mm in a microwave band.

15. A multispectral imaging (MSI) chip, comprising:
A pixelated focal plane array (FPA) that detects M×N images of incident photons originating from a scene over a broad spectral band;
at least one photonic crystal layer having one or more photonic band gaps that block transmission of photons over one or more portions of the broad spectral band, each said at least one photonic crystal layer being spatially segmented to independently filter cells comprising P×Q pixels;
a tuning mechanism that tunes said photonic band gaps to filter photons through said at least one layer within a passband to said FPA;
a read out integrated circuit (ROIC) that reads out the detected photons for each pixel in the FPA; and
a processor that controls the ROIC to read out the detected photons at a specified spatial resolution and integration period and controls the tuning mechanism to set the passband to a specified wavelength and resolution in the different cells independently.

16. The MSI chip of claim 15, wherein the processor processes the read out photons to detect any anomalies in an image.

17. The MSI chip of claim 16, wherein the processor controls the ROIC and tuning mechanism to reconfigure the spatial resolutions, integration periods and passbands of the different cells based on the detection of said anomalies to better resolve said anomalies.

18. The MSI chip of claim 16, wherein the processor controls the ROIC to store and average sequential temporal images of a scene, detect and correct spatial registration mismatches across one or more temporal images, measure and compress the range of intensities for an image, cell-by-cell.

19. The MSI chip of claim 16, wherein the processor sets an initial configuration based on a priori knowledge of the scene and/or possible anomalies.

20. A multispectral imaging chip, comprising:
an M×N pixelated focal plane array (FPA) that detects incident photons over a broad spectral band;
a plurality of photonic crystal layers each having a photonic band gap structure with a different photonic band gap that blocks transmission of photons over a portion of the broad spectral band, said layers being segmented to independently address cells comprising P×Q pixels in the FPA;
a read out integrated circuit (ROIC) that reads out the detected photons for each pixel in the FPA;
a tuning mechanism that tunes said photonic band gaps to filter photons through a passband in each cell to said FPA; and
a processor that controls the ROIC to read out the detected photons at a specified spatial resolution and integration period and controls the tuning mechanism to set the passband to a specified wavelength and resolution in the different cells independently.

21. The MSI chip of claim 20, wherein P equals Q equals 1.

22. The MSI chip of claim 20, wherein the processor (a) based on a priori knowledge of the scene and/or possible anomalies sets an initial configuration for the ROIC to read out the detected photons at a specified spatial resolution and integration period and for the tuning mechanism to set the passband to a specified wavelength and resolution in the different cells, (b) processes the read out photons to detect any anomalies in a scene, (c) controls the ROIC and tuning mechanism to reconfigure the spatial resolutions, integration periods, and passbands of the different cells based on the detection of said anomalies to better resolve said anomalies.

23. The MSI chip of claim 20, wherein at any given wavelength in the broad spectral band there are two overlapping photonic band gaps, said tuning mechanism moving the overlapping band gaps that cover the passband away from the passband allowing transmission and controlling the width of the passband by the relative placement of edges of the previously overlapping band gaps.

24. The MSI chip of claim 20, wherein the photonic band gaps are non-overlapping and switchable between reflective and transmissive states, said tuning mechanism switching all of the band gaps to the reflective state except one and switching the one layer whose band gap encompasses the passband to the transmissive state.

25. The MSI chip of claim 20, wherein at least one of said photonic crystal layers exhibits a plurality of said photonic band gaps, said tuning mechanisms tuning one of said plurality of photonic band gaps while leaving the others unchanged.

26. A multispectral imaging chip for detecting anomalies in a scene, comprising:
an M×N pixelated focal plane array (FPA) that detects incident photons over a broad spectral band;
a plurality of photonic crystal layers each having a photonic band gap structure with a different photonic band gap that blocks transmission of photons over a portion of the broad spectral band, said layers being segmented to independently address cells comprising P×Q pixels in the FPA;
a read out integrated circuit (ROIC) that reads out the detected photons for each pixel in the FPA;

a tuning mechanism that tunes said photonic band gaps to filter photons through a passband in each cell to said FPA; and a processor that (a) based on a priori knowledge of the scene and/or possible anomalies sets an initial configuration for the ROIC to read out the detected photons at a specified spatial resolution and integration period and for the tuning mechanism to set the passband to a specified wavelength and resolution in the different cells, (b) processes the read out photons to detect any anomalies in a scene, (c) controls the ROIC and tuning mechanism to reconfigure the spatial resolutions, integration periods, and passbands of the different cells based on the detection of said anomalies to better resolve said anomalies.

27. The MSI chip of claim 26, wherein P equals Q equals 1.

28. The MSI chip of claim 26, wherein at any given wavelength in the broad spectral band there are two overlapping photonic band gaps, said tuning mechanism moving the overlapping band gaps that cover the passband away from the passband allowing transmission and controlling the width of the passband by the relative placement of edges of the previously overlapping band gaps.

29. The MSI chip of claim 26, wherein the photonic band gaps are non-overlapping and switchable between reflective and transmissive states, said tuning mechanism switching all of the band gaps to the reflective state except one and switching the one layer whose band gap encompasses the passband to the transmissive state.

30. The MSI chip of claim 26, wherein at least one of said photonic crystal layers exhibits a plurality of said photonic band gaps, said tuning mechanisms tuning one of said plurality of photonic band gaps while leaving the others unchanged.

* * * * *